United States Patent
Cousins et al.

(10) Patent No.: US 10,362,670 B2
(45) Date of Patent: Jul. 23, 2019

(54) FABRIC SIGNAL PATH STRUCTURES FOR FLEXIBLE DEVICES

(71) Applicant: Apple Inc., Cupertino, CA (US)

(72) Inventors: Benjamin A. Cousins, Burlington (CA); Kurt R. Stiehl, San Jose, CA (US); Samuel G. Smith, San Francisco, CA (US); Kirk M. Mayer, San Francisco, CA (US); Siddhartha Hegde, San Jose, CA (US); Melody Kuna, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/882,836

(22) Filed: Jan. 29, 2018

(65) Prior Publication Data

US 2018/0168027 A1 Jun. 14, 2018

Related U.S. Application Data

(63) Continuation of application No. 14/843,617, filed on Sep. 2, 2015, now Pat. No. 9,883,583.

(51) Int. Cl.
| | |
|---|---|
| H05K 1/02 | (2006.01) |
| H05K 3/00 | (2006.01) |
| H05K 1/03 | (2006.01) |
| H05K 3/10 | (2006.01) |
| G06F 1/16 | (2006.01) |

(Continued)

(52) U.S. Cl.
CPC .......... *H05K 1/028* (2013.01); *A45C 13/005* (2013.01); *G06F 1/1626* (2013.01); *G06F 1/1656* (2013.01); *G06F 1/1662* (2013.01); *G06F 1/1683* (2013.01); *H05K 1/0296* (2013.01); *H05K 1/038* (2013.01); *H05K 1/0393* (2013.01); *H05K 1/09* (2013.01); *H05K 1/111* (2013.01);
(Continued)

(58) Field of Classification Search
CPC .... H05K 1/0277; H05K 1/0278; H05K 1/028; H05K 1/0283; H05K 3/0011
See application file for complete search history.

(56) References Cited

U.S. PATENT DOCUMENTS

| | | | |
|---|---|---|---|
| 7,115,844 B2 | 10/2006 | Ferguson | |
| 8,022,307 B2 | 9/2011 | Chu et al. | |

(Continued)

FOREIGN PATENT DOCUMENTS

| | | |
|---|---|---|
| CN | 1423769 | 6/2003 |
| CN | 1304633 | 7/2007 |

(Continued)

*Primary Examiner* — Jeremy C Norris
(74) *Attorney, Agent, or Firm* — Treyz Law Group, P.C.; G. Victor Treyz; Kendall W. Abbasi

(57) ABSTRACT

An electronic device such as a cover for a portable device may be provided with a body having hinge portions. The hinge portions may allow the body to bend about one or more bend axes. The cover may have electrical components such as a keyboard. A keyboard may be mounted at one end of the cover and a connector may be mounted at an opposing end of the cover. A flexible fabric signal path structure may be formed from metal traces on a flexible fabric substrate. At one end of the cover, the flexible fabric signal path structure may be coupled to a printed circuit in the keyboard using conductive adhesive. At the opposing end of the cover, the metal traces on the flexible fabric substrate may be coupled to the connector.

20 Claims, 16 Drawing Sheets

(51) Int. Cl.
  H05K 1/09    (2006.01)
  H05K 1/11    (2006.01)
  A45C 13/00   (2006.01)
  H04M 1/18    (2006.01)
  H04M 1/23    (2006.01)
  A45C 11/00   (2006.01)
  H05K 1/18    (2006.01)
  H05K 3/06    (2006.01)

(52) U.S. Cl.
  CPC .......... H05K 3/10 (2013.01); *A45C 2011/003* (2013.01); *H04M 1/185* (2013.01); *H04M 1/23* (2013.01); *H05K 1/189* (2013.01); *H05K 3/06* (2013.01); *H05K 3/108* (2013.01); *H05K 2201/05* (2013.01)

(56) References Cited

U.S. PATENT DOCUMENTS

| | | |
|---|---|---|
| 9,048,597 B2 | 6/2015 | Peterson et al. |
| 9,075,566 B2 | 7/2015 | Whitt, III et al. |
| 2005/0244620 A1 | 11/2005 | Tsunekawa et al. |
| 2007/0149001 A1* | 6/2007 | Uka .................. C23C 26/00 439/67 |
| 2008/0105527 A1 | 5/2008 | Leftly |
| 2012/0106078 A1* | 5/2012 | Probst .................. G06F 1/1616 361/679.56 |
| 2014/0022177 A1 | 1/2014 | Shaw et al. |
| 2014/0239276 A1 | 8/2014 | Lin et al. |
| 2015/0217406 A1 | 8/2015 | Canonico et al. |

FOREIGN PATENT DOCUMENTS

| | | |
|---|---|---|
| CN | 101240475 | 8/2008 |
| CN | 104010446 | 8/2014 |
| CN | 104252197 | 12/2014 |
| CN | 104798447 | 7/2015 |
| DE | 3116348 | 9/1982 |
| EP | 2413572 | 9/2015 |
| JP | S57-050978 U | 3/1982 |
| JP | S61-107792 A | 5/1986 |
| JP | 2013-084246 A | 5/2013 |
| JP | 2015-018469 A | 1/2015 |

* cited by examiner

FABRIC SIGNAL PATH STRUCTURES FOR FLEXIBLE DEVICES

This application is a continuation of U.S. patent application Ser. No. 14/843,617, filed Sep. 2, 2015, which is hereby incorporated by reference herein in its entirety.

BACKGROUND

This relates generally to electronic devices, and, more particularly, to flexible signal path structures for electronic devices.

Electronic devices may include circuitry that is interconnected using signal lines on printed circuits. In some devices, parts of a device may move with respect to each other. For example, the display housing and the base housing of a laptop computer are coupled to each other with a hinge to allow the display housing to move relative to the base housing. Flexible signal cables such as flexible printed circuits with signal busses formed from metal traces can be used to couple circuitry in the base housing of a laptop computer to the display housing of the laptop computer. The signal busses may be used to transfer signals between the base housing and display housing, even as the base housing and display housing are moved with respect to each other about the hinge.

Flexible printed circuit cables have flexible polymer substrates such as sheets of polyimide, thin film polyamide (nylon), polyester on which the metal traces for the signal busses are formed. The polymer substrates may not bend as sharply as desired for certain applications and can be difficult to conceal in within some types of devices.

It would therefore be desirable to be able to provide improved flexible signal path structures.

SUMMARY

An electronic device such as a cover for a portable device may be provided with a body having hinge portions or other tight radius flex lines. The hinge portions may allow the body to bend about one or more bend axes. For example, sections of the cover may be folded along the bend axes to create a support for the portable device. The portable device may be a tablet computer or other device without a keyboard. A keyboard for providing input to the portable device may be formed in the cover.

The keyboard may be mounted at one end of the cover and a connector that mates with the portable device may be mounted at an opposing end of the cover. A flexible fabric signal path structure may be used to route signals between the keyboard and the connector. The flexible fabric signal path structure may overlap the bend axes of the body and may accommodate bending along the bend axes.

The flexible fabric signal path structure may be formed from metal traces on a flexible fabric substrate. At one end of the cover, the flexible fabric signal path structure may be coupled to a printed circuit in the keyboard using conductive adhesive. At the opposing end of the cover, the metal traces on the flexible fabric substrate may be coupled to the connector.

DETAILED DESCRIPTION

Figure 1:
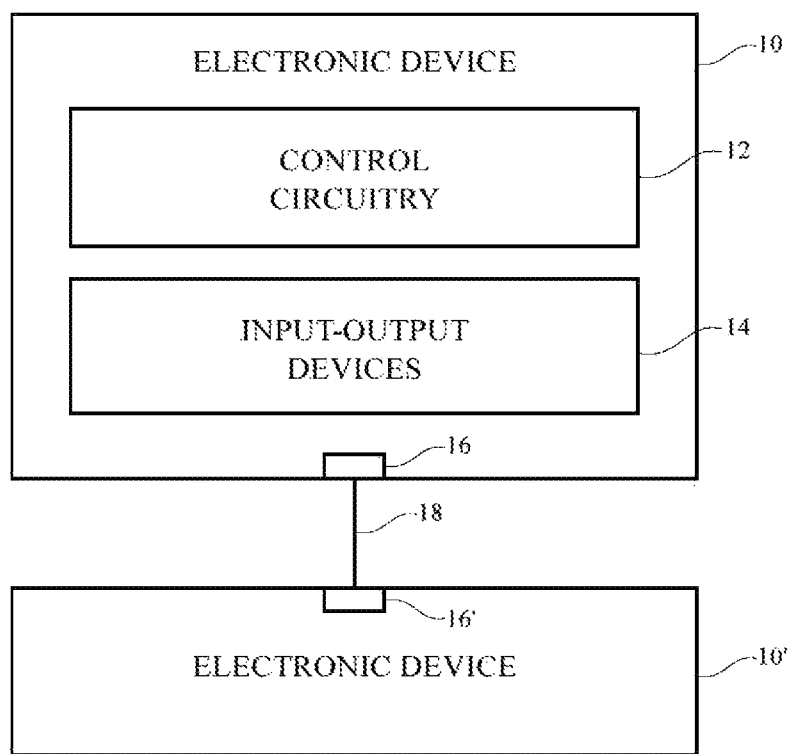
FIG. 1 is a schematic diagram of illustrative electronic equipment of the type that may include a flexible signal path in accordance with an embodiment.

A schematic diagram of illustrative electronic equipment that may be provided with flexible fabric signal path structures is shown in FIG. 1. Electronic device 10 and electronic device 10' of FIG. 1 may be operated independently or may be coupled to each other. A device such as device 10 and/or device 10' may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a case, bag, watch band, or other accessory that operates in conjunction with one of these devices or other equipment, equipment that implements the functionality of two or more of these devices, or other electronic equipment. As an example, device 10 may be a portable device such as a cellular telephone or media player and device 10' may be an accessory such as a cover (sometimes referred to as a case or enclosure). Other configurations may be used for device 10 and/or device 10' if desired. The example of FIG. 1 is merely illustrative.

Electronic device 10 may have control circuitry 12. Control circuitry 12 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 12 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 14 may be used to allow data to be supplied to device 10 and to allow data to be provided from device 10 to external devices. Input-output devices 14 may include a display, buttons, joysticks, scrolling wheels, touch pads, key pads, keyboards, audio components such as microphones and speakers, tone generators, vibrators, cameras, sensors, light-emitting diodes and other status indicators, data ports, etc. Wireless circuitry in devices 14 may be used to transmit and receive radio-frequency wireless signals. Wireless circuitry may include antennas and radio-frequency transmitters and receivers operating in wireless local area network bands, cellular telephone bands, and other wireless communications bands.

A user can control the operation of device 10 by supplying commands through input-output devices 14 and may receive status information and other output from device 10 using the output resources of input-output devices 14. Control circuitry 12 may be used to run software on device 10 such as operating system code and applications. During operation of device 10, the software running on control circuitry 12 may use input-output devices 14 to gather user input and other input and can provide the user with visual output, audio output, and other output.

Device 10' may include the same circuitry as device 10 and/or may contain different circuitry. Devices 10 and 10' may include respective connections 16 and 16' and signal paths such as path 18. Connections 16 and 16' may be formed using solder, conductive adhesive, welds, connectors, and/or other structures for forming electrical and/or mechanical structures. Path 18 may be used to share input and output information between devices 10 and 10'. Portions of paths such as path 18 may be included in devices 10 and/or 10'.

Devices such as devices 10 and 10' may be used together. For example, the input resource of the input-output devices in device 10' may be used to gather input from a user. This user input may then be conveyed to device 10 over signal path 18 for use in controlling the operation of device 10. If, for example, device 10' includes a keyboard, a user may supply key press input to device 10' that is conveyed via path 18 (e.g., a path that is separate from device 10' and/or that is included in device 10') to device 10. Device 10 may also use the resources of device 10' to provide the user with output. For example, device 10 can supply output to device 10' over path 18 that instructs device 10' to turn on or off particular light-emitting diodes or other status indicators or that instructs device 10' to provide other visual and/or audio output for the user.

Signal paths such as path 18 between devices 10 and 10' and portions of signal paths such as path 18 that are contained within devices 10 and 10' may be formed from flexible fabric layers. These fabric layers may accommodate bends (e.g., tight bends) in the structures that make up devices 10 and/or 10' and may facilitate concealment of the signal paths (e.g., to enhance device aesthetics in a device with a thin and flexible outer housing).

Figure 2:
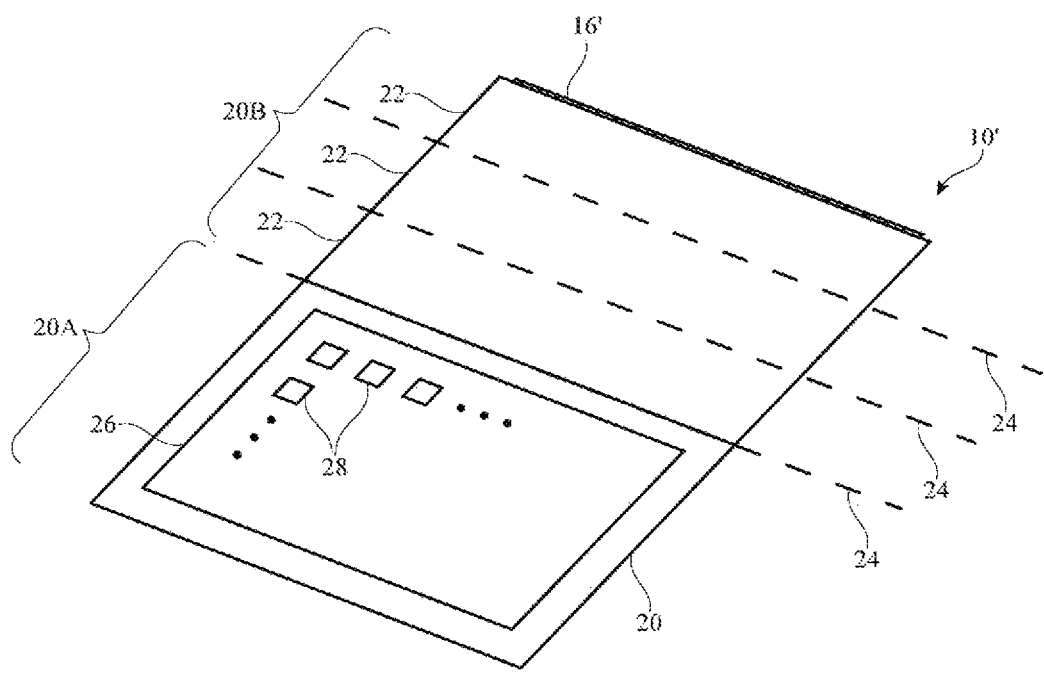
FIG. 2 is a perspective view of an illustrative tablet computer cover with flexible structures that accommodate bending in accordance with an embodiment.

A perspective view of an illustrative device of the type that may be provided with a flexible fabric signal path is shown in FIG. 2. As shown in FIG. 2, device 10' may be a flexible cover that can be used to protect an electronic device such as a tablet computer or other computing device. Device 10' (sometimes referred to herein as cover 10') may include body 20. Body 20 may have surfaces formed from plastic, fabric, microfiber embedded in a polymer layer, or other suitable materials. For example, one side of body 20 (e.g., the exterior of body 20 when cover 10' is closed around device 10) may be formed from a sheet of polymer and the other side of body 20 (e.g., the inner surface of body 20) may be formed from a microfiber layer.

Cover 10' may include input-output components such as keyboard 26, a touch pad (trackpad) that gathers touch and/or force input, and/or other input-output devices. Keyboard 26 may include keys 28. Keyboard 26 may be mounted in lower portion 20A of cover 10'. Upper portion 20B of cover 10' may contain foldable sections (horizontal strips) such as sections 22. Sections 22 may bend about one or more bend axes such as bend axes 24.

Upper portion 20B may have a connector such as connector 16'. Connector 16' may mate with a connector such as connector 16 that is associated with device 10 (i.e., when device 10 is mated with cover 10'). Connector 16' may contain electrical contacts for coupling to corresponding connector contacts in connector 16. These contacts may be electrically coupled to electrical components in lower portion 20A such as keyboard 26 (e.g., one or more integrated circuits for gathering keystroke information during the operation of keys 28 in keyboard 26).

To accommodate bending of housing 20 about bend axes 24, housing 20 may be provided with flexible hinge portions along the boundaries between sections 22 (i.e., along axes 24). A signal path for coupling connector 16' to circuitry in keyboard 26 may run across axes 24 (i.e., the signal path may cross each of axes 24 at a right angle so as to extend between connector 16' and keyboard 26). Because the signal path overlaps bend axes 24, the signal path is preferably formed from a flexible signal path structure. With one suitable arrangement, the flexible signal path structure may be formed from a flexible fabric signal path structure having metal traces on a flexible fabric substrate or having conductive strands of material that are formed as part of the flexible fabric substrate.

Figure 3:
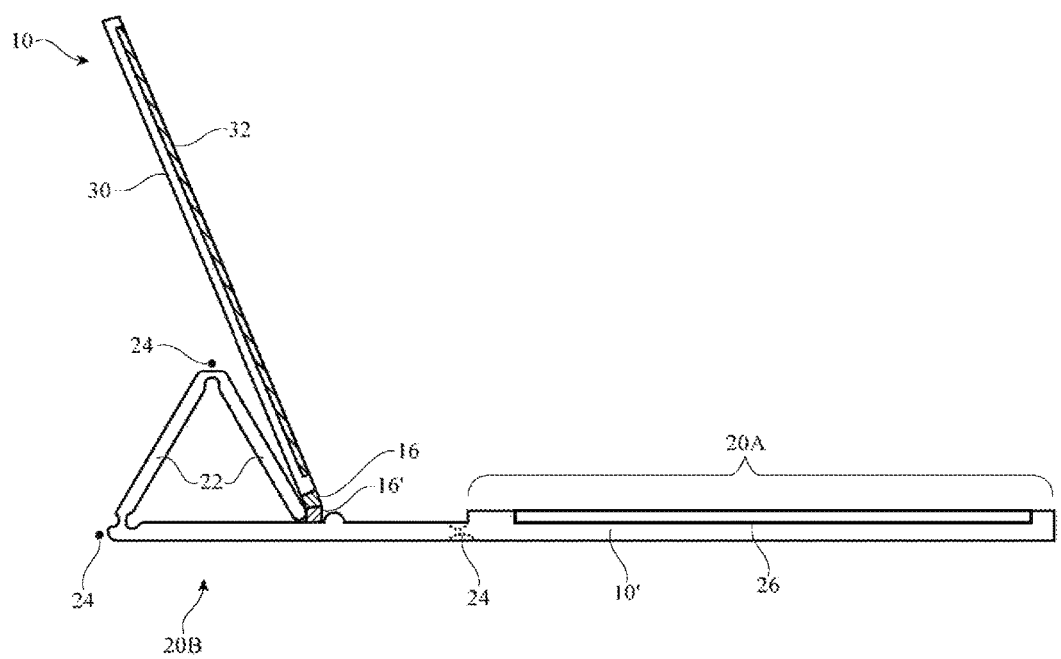
FIG. 3 is a cross-sectional side view of an illustrative tablet computer mated with an illustrative tablet computer cover in accordance with an embodiment.

A cross-sectional side view of cover 10' and an associated device such as device 10 is shown in FIG. 3. As shown in FIG. 3, cover 10' may be folded along bend axes 24 to form a stand for device 10. Device 10 may have a housing such as housing 30 and a display such as display 32 that is mounted in housing 30. Cover 10' may support device 10 in a position that allows display 32 to be easily viewed by a user while the user is typing on keyboard 26. When device 10 is supported by cover 10', connector 16 of device 10 may mate with connector 16' of cover 10'. Cover 10' may bend along axis such as axis 24 and/or other bend axes that span the width of cover 10'.

Figure 4:
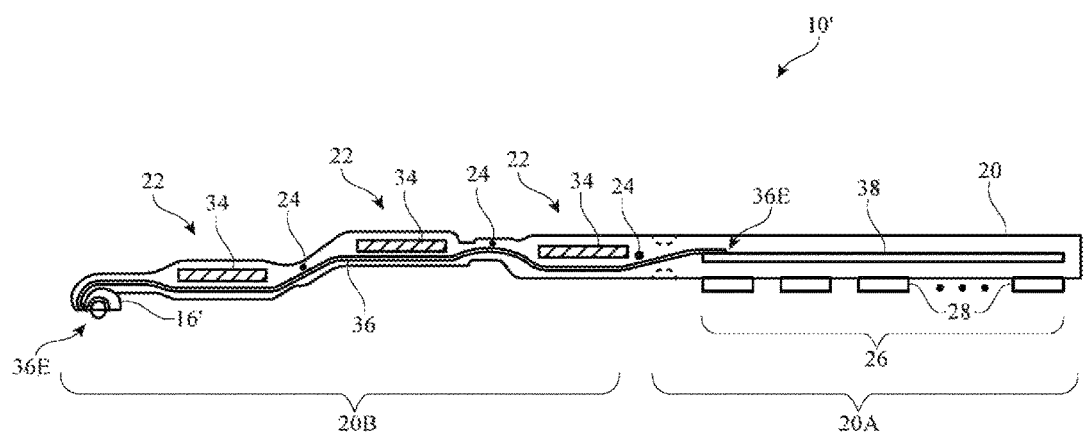
FIG. 4 is a cross-sectional side view of a cover of the type shown in FIG. 3 showing how the cover may be provided with a flexible fabric signal path structure in accordance with an embodiment.

As shown in the illustrative cross-sectional side view of cover 10' of FIG. 4, cover 10' may have stiffeners such as fiberglass stiffeners 34 (e.g., stiff rectangular panels of material). Flexible fabric signal path structure 36 may have ends 36E that are coupled between connector 16' and printed circuit 38. Printed circuit 38 may be located in lower body portion 20A of body 20 and may contain circuitry for controlling the operation of keyboard 26 (e.g., key switches, integrated circuits, signal traces, etc.). Flexible fabric signal path structure 36 may span locally thinned portions of body 20 that serve as hinges along bend axes 24.

Fabric structure 36 may include one or more signal paths. In configurations in which structure 36 contains multiple signal paths, the signal paths may be formed from a series of parallel metal traces that run along the length of fabric structure 36 (i.e., between connector 16' and printed circuit 38) and that serve as a signal bus. Analog and/or digital signals may be conveyed along this type of signal bus. There may be any suitable number of metal lines in a signal bus on fabric structure 36 (e.g., more than one, two, three, three or more, four or more, 10 or more, 10-20, 10-100, more than 50, less than 200, less than five, or other suitable number).

Figure 5:
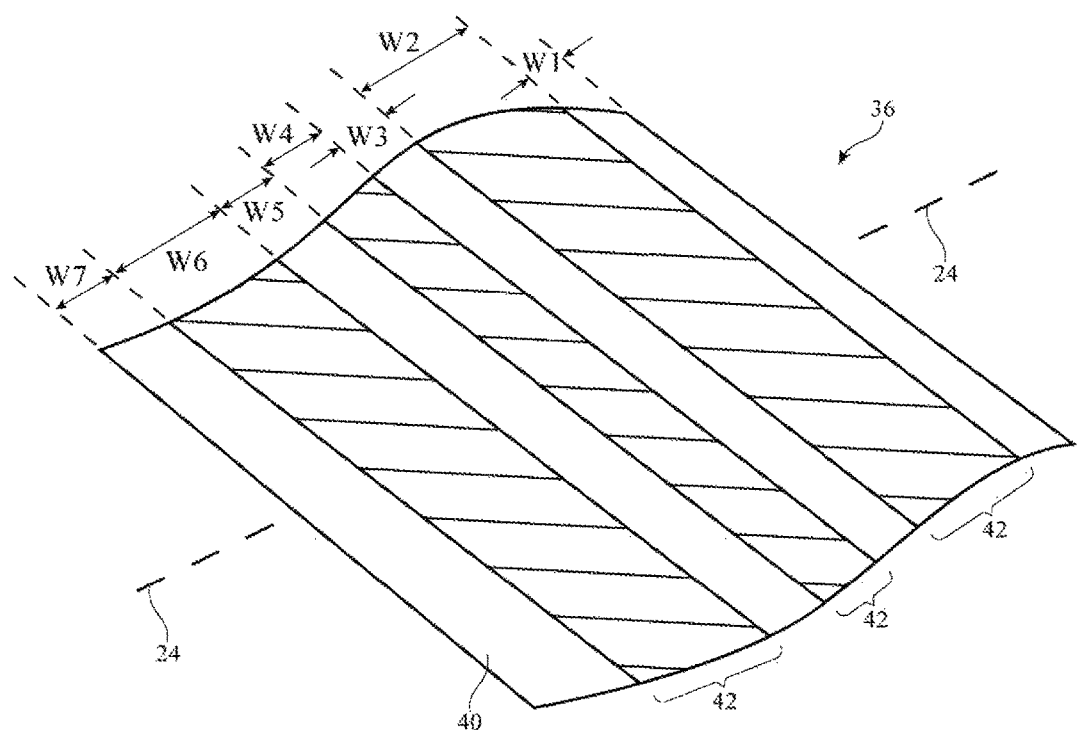
FIG. 5 is a perspective view of an illustrative flexible fabric signal path structure in accordance with an embodiment.

A perspective view of an illustrative three-wire signal bus formed from metal traces on flexible fabric structure 36 is shown in FIG. 5. As shown in FIG. 5, fabric structure 36 may have a fabric substrate such as substrate 40 and metal traces 42. There are three metal traces 42 in FIG. 5, but more metal traces 42 or fewer metal traces 42 may be formed, if desired. As shown by illustrative bend axis 24, metal traces 42 may be elongated traces that run perpendicular to bend axis 24 and that overlap bend axis 24 (and, if desired, multiple bend axes 24). If desired, metal traces 42 may include portions that intersect bend axis 24 at other angles, may include portions that run parallel to bend axis 24, etc.

Traces 42 may be used for handling any suitable digital and/or analog signals. With one suitable arrangement, the centermost one of the three traces 42 of FIG. 5 may be a data trace and the flanking outer traces on the left and right of the center trace may be ground traces (as an example). The center trace may have a width W4 and the outer traces may have respective widths W6 and W2. Trace-free portions of fabric substrate 40 may have respective widths of W7, W5, W3, and W1. The values of W1, W2, W3, W4, W5, W6, and W7 may be 0.1 mm to 100 mm, may be 0.5 cm to 3 cm, may be 0.5-10 cm, may be more than 0.3 cm, may be more than 0.5 cm, may be more than 1 cm, may be 1-4 cm, may be 1-10 cm, may be more than 2 cm, may be less than 10 cm, may be less than 5 cm, may be less than 2 cm, or may be any other suitable widths. The use of relatively wide trace widths for traces 42 may help lower trace resistance. A large number of traces need not be used in scenarios in which the circuitry of cover 10' does not need to communicate with device 10 over a wide bandwidth signal path (e.g., when only keystroke data and similar low-bandwidth data is transferred from cover 10' to device 10).

Figure 6:
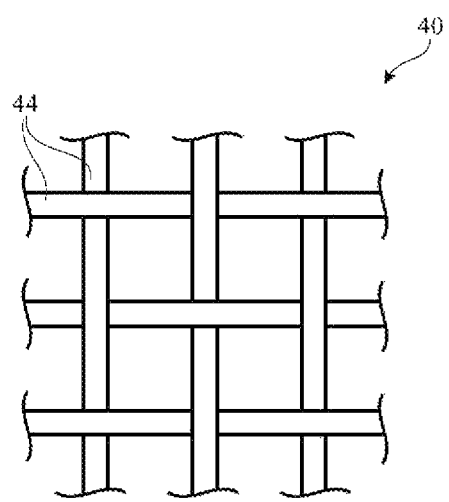
FIG. 6 is a diagram of an illustrative fabric that may be used in forming the flexible fabric signal path structure of FIG. 5 in accordance with an embodiment.

Fabric for substrate 40 may be formed from intertwined strands of material such as strands 44 of FIG. 6. Strands 44 may be formed from dielectric material such as polymer and/or conductive material such as metal. For example, strands 44 may be formed from metal (e.g., metal wires), may be formed from polymer, may be formed from polymer coated with metal, may be coated with insulation or may be free of insulating coatings, may be formed from monofilaments, may be formed from multiple filaments that are intertwined to form multi-filament strands, and/or may be formed from other suitable strands of material. Strands 44 may be processed using a resist print technique that selectively prevents the deposition of metal or other added material, may be selectively etched (e.g., to remove metal), may be etched by selectively activating metal etchant, may be processed to selectively activate catalyst so as to control the deposition of metal or other materials, or may be processed using other processing techniques. Strands 44 may be intertwined to form substrate 40 using weaving techniques, using knitting techniques, using braiding techniques, and/or using other fiber intertwining techniques (e.g., felt fabrication techniques). In the example of FIG. 6, fabric 40 has vertical strands of material and intertwined horizontal strands of material. The vertical strands of material may be warp fibers and the horizontal strands of material may be weft fibers (as an example). Fabric 40 may be a woven fabric having a plain weave, basket weave, a ripstop construction (e.g., a reinforced fabric construction in which strands of material of enhanced strength are interspersed with strands of material of normal strength to help prevent tears from propagating). With one suitable arrangement, fabric substrate 40 is a woven nylon ripstop fabric. Other types of fabric may be used in forming substrate 40 if desired.

Conductive signal paths in fabric structure 36 may be formed from conductive strands of material in fabric 40, from metal that is coated onto portions of fabric 40, or other suitable conductive paths.

Figure 7:
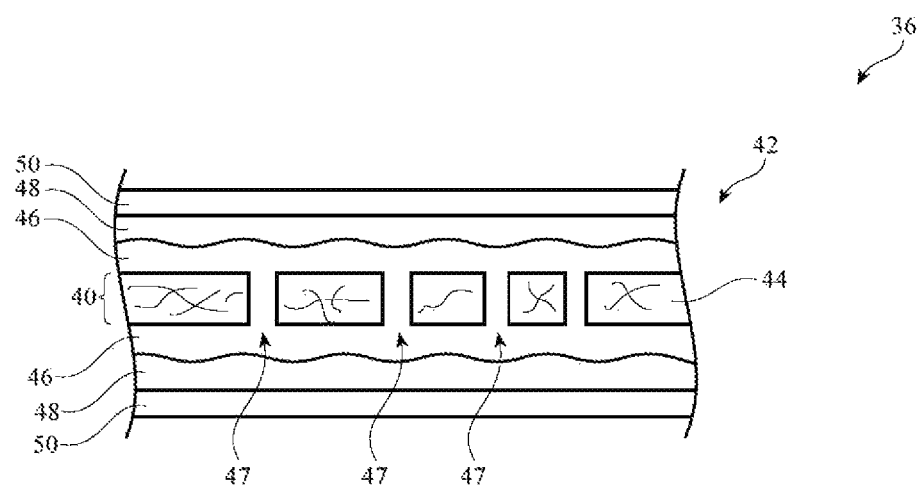
FIG. 7 is a cross-sectional side view of a portion of a flexible fabric signal path structure in accordance with an embodiment.

FIG. 7 is a cross-sectional side view of fabric structure 36 in an illustrative configuration in which metal traces 42 have been formed by depositing and patterning metal onto fabric substrate 40. In the example of FIG. 7, fabric 40 has openings 47 (e.g., openings between strands of material such as strands 44) that receive portions of inner metal layer 46 when metal layer 46 is deposited on substrate 40. Due to the presence of openings 47, metal layer 46 may penetrate through fabric 40. Metal layer 47 may be formed on one side of fabric 40 or metal layer 47 may coat both the upper and opposing lower surfaces of fabric 40.

Metal traces 42 may be formed from patterned portions of the deposited metal. The metal layer on fabric 40 may have one or more layers (e.g., layers such as layers 46, 48, and 50 that have been formed using different deposition techniques and/or using different elemental or alloyed metals). As an example, inner metal layer 46 may be formed from a high conductivity metal such as electroless copper or electroless nickel. One or more additional layers such as layers 48 and 50 may be deposited on one or both sides of fabric 36 (e.g., on the top and/or bottom of layer 46). The additional layer(s) may be used to help protect layer 46 and/or to provide additional desirable qualities (strength, low resistance, adhesion, oxidation protection, solder compatibility, etc.). With one illustrative configuration, layers 48 and/or 50 may be formed from materials with a high conductivity such as electroless or electrolytic plated silver and/or other electroless and/or electrolytic plated metals such as copper or tin. Optional layer 50 (e.g., a layer of nickel) may be the outermost layer of metal traces 42 and may help make trace 42 solder compatible or may be omitted (in which case layer 48 may serve as the outermost metal layer). The illustrative structures shown in FIG. 7 include metal trace layers for metal trace 42 that are on both the upper and lower surfaces of fabric 40. This is merely illustrative. Some or all of the metal on fabric 40 such as metal layers 46, 48, and/or 50 may be located on only one side of fabric 40 (i.e., structure 36 may include metal traces 42 that are primarily or exclusively formed on one of its two opposing surfaces).

Figure 8:
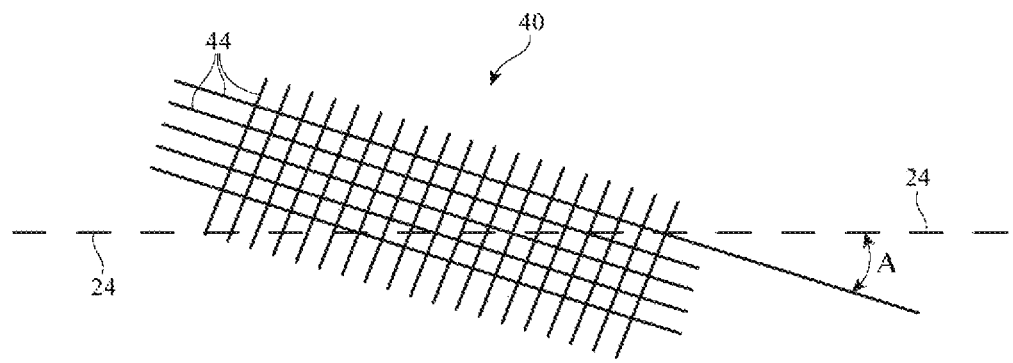
FIG. 8 is a diagram showing how a flexible fabric substrate may have strands of material that are offset at an acute non-zero angle with respect to a bend axis in accordance with an embodiment.
Figure 9:
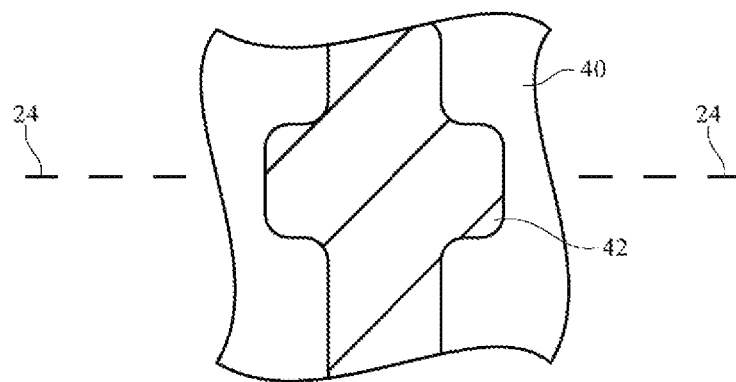
FIG. 9 is a top view of a portion of a flexible fabric signal path structure with a locally enlarged signal path width to enhance reliability when bent in accordance with an embodiment.
Figure 10:
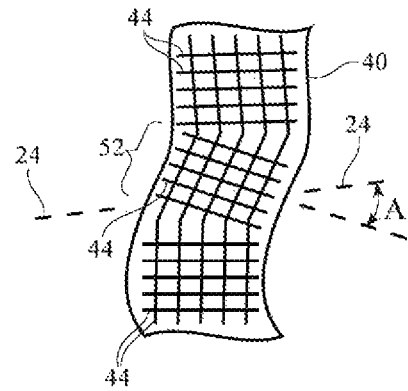
FIG. 10 is a top view of a portion of a flexible fabric signal path structure with a locally modified portion in which strands of material have a non-zero angular offset relative to a bend axis in accordance with an embodiment.

It may be desirable to orient the strands of material in fabric substrate 40 at a non-zero angle with respect to bend axis 24 (e.g., a non-zero acute angle) to enhance reliability. As shown in the example of FIG. 8, strands 44 may be oriented at a non-zero angle A with respect to bend axis 24. Angle A may be, for example, 3°, 0-10°, 1-10°, more than 2°, less than 20°, or other suitable angle. Traces 42 can also be locally widened to help accommodate bending. For example, traces 42 can be widened where traces 42 overlap bend axis 24 to help prevent crack-induced open circuits, as shown in FIG. 9. FIG. 10 shows how strands 44 may run parallel (or perpendicular) to bend axis 24 except in a local region such as local region 52 where fabric 40 overlaps bend axis 24. In region 52, strands 44 may be oriented at a non-zero angle A with respect to bend axis 24, as described in connection with FIG. 8.

Figure 11:
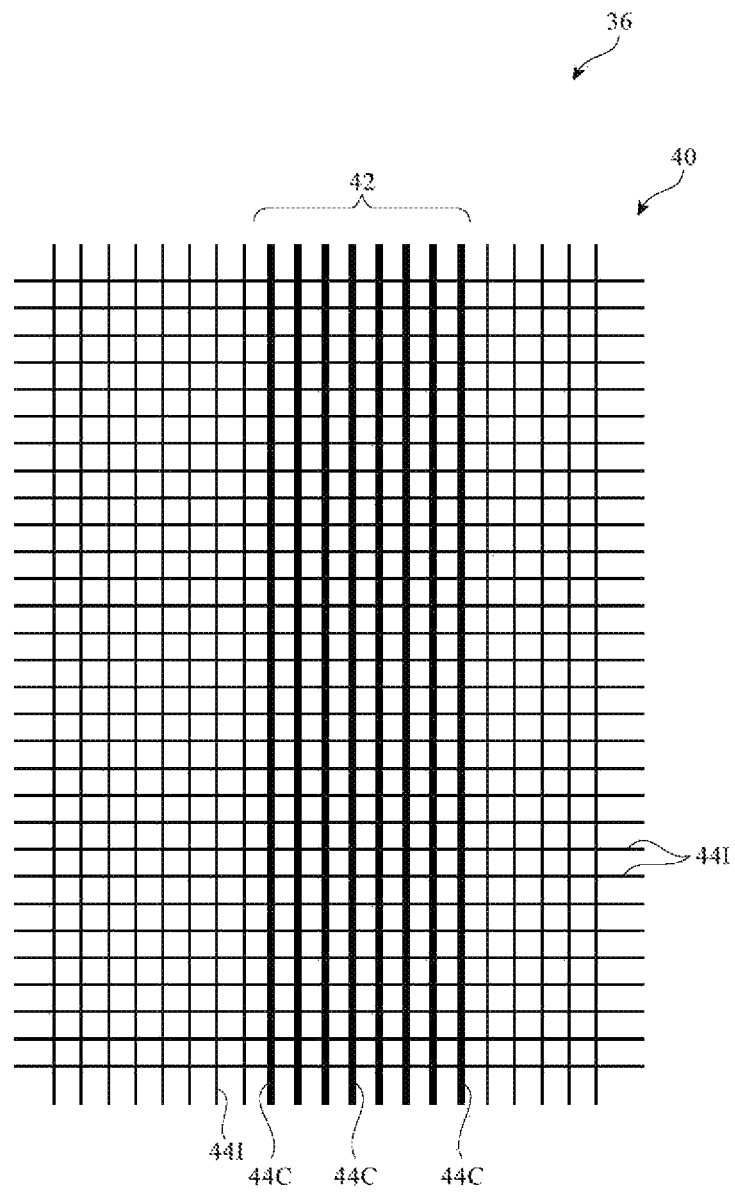
FIG. 11 is a diagram of an illustrative fabric having conductive strands that form a signal path in accordance with an embodiment.

As shown in FIG. 11, a signal path (metal path 42) in structure 36 may be formed from conductive metal strands of material (strands 44C). Insulating fibers 44I may prevent short circuits between different paths 42. Conductive strands 44C may be bare metal wires, may be polymer strands coated with metal (and optionally an outer insulating coating that can be selectively removed when forming connections with circuitry in devices 10 and/or 10').

Figure 12:
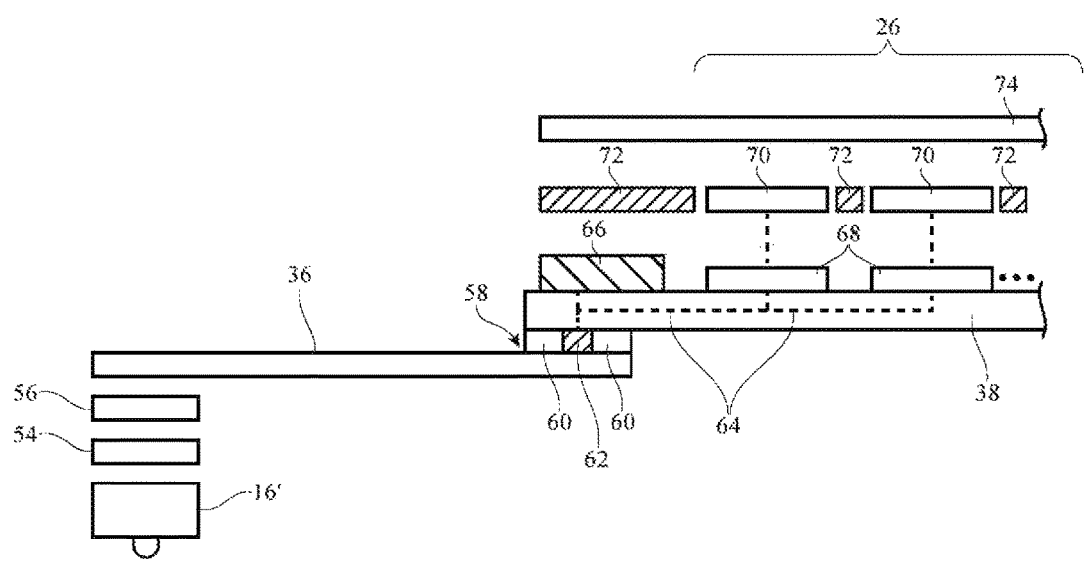
FIG. 12 is a cross-sectional side view of circuitry for a case that is being coupled together using a flexible fabric signal path in accordance with an embodiment.

FIG. 12 is an illustrative side view of structures that may be used in forming a device (e.g., cover 10') that includes fabric structure 36. As shown in FIG. 12, connector 16' may be coupled to fabric structure 36 using structures such as flexible printed circuit 54 (e.g., a printed circuit containing metal interconnect traces to which connector 16' may be soldered) and conductive pressure sensitive adhesive 56 (which may couple the traces of printed circuit 54 to fabric structure 36).

Keyboard 26 may be coupled to fabric structure 36 at one of the ends of structure 36. Keyboard 26 may include printed circuit 38. Integrated circuit 66 and/or other circuitry may be mounted on printed circuit 38 to serve as control circuitry for controlling keyboard 26. Integrated circuit 66 and/or other control circuitry on printed circuit 38 may gather keystroke data from the keys in keyboard 26 and may communicate this information to device 10 via printed circuit interconnects 64, metal traces 42 in fabric structure 36, and connector 16'.

Figure 13:
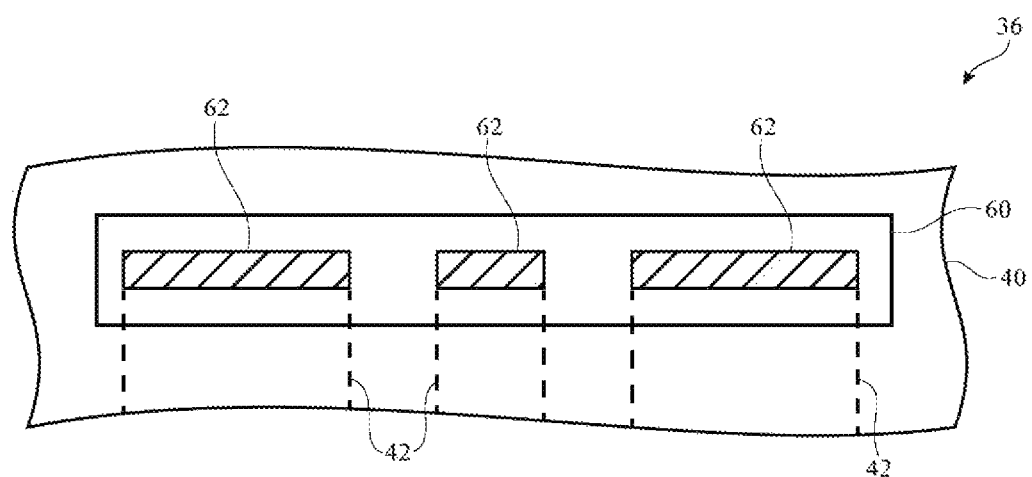
FIG. 13 is a top view of an adhesive pattern that may be used in coupling contacts on a flexible fabric signal path structure to another structure such as a printed circuit in accordance with an embodiment.

The keys for keyboard 26 may be formed from an array of key switches 68 mounted on the upper surface of printed circuit 38. Plastic key web 72 may have openings that receive key caps 70. Key caps 70 may be aligned with respective key switches 68 to form the keys of keyboard 26. Fabric cover 74 or other covering material may be used to cover the outer surface of keyboard 26. Printed circuit 38 may be coupled to metal traces 42 in fabric structure 36 using adhesive layer 58. Adhesive layer 58 may include conductive adhesive 62 surrounded by non-conducting (insulating) adhesive 60. FIG. 13 is a top view of fabric structure 36 showing how conductive adhesive 62 may form rectangular regions on fabric 40. Conductive adhesive 62 may overlap the ends of traces 42 and may be surrounded by insulating adhesive 60.

Figure 14:
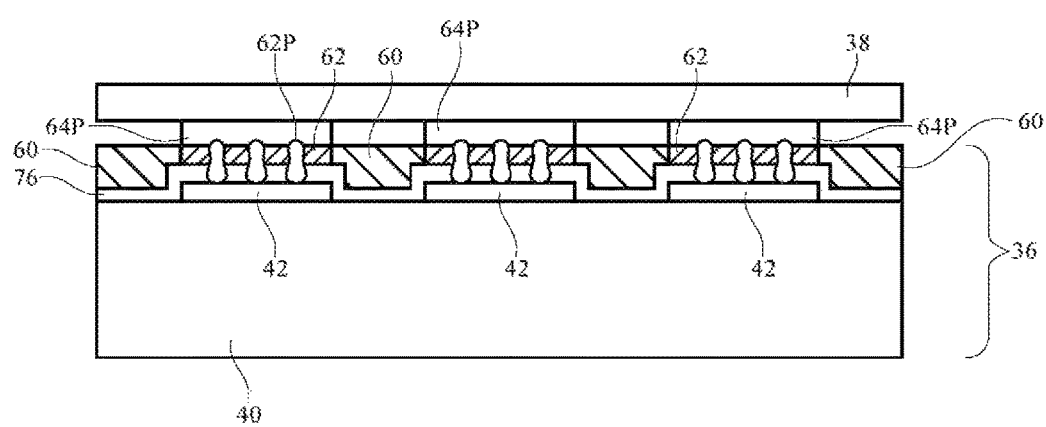
FIG. 14 is a cross-sectional side view of an illustrative flexible fabric signal path structure coupled to a printed circuit in accordance with an embodiment.

FIG. 14 shows how structure 36 may be coupled to printed circuit 38. Printed circuit 38 may have metal contact pads 64P that are shorted to traces 64 in printed circuit 38. Fabric structure 36 may include fabric substrate 40. Metal traces 42 may be formed on substrate 40. A thin dielectric coating (i.e., a thin insulating polymer protective layer) may cover the surface of substrate 40 and metal traces 42. Conductive adhesive 62 may be patterned in rectangles or other suitable shapes (see, e.g., conductive adhesive 62 of FIG. 13) to overlap the ends of metal traces 42. Insulating adhesive 60 may surround each rectangle of conductive adhesive 62. When printed circuit 38 and fabric structure 36 are pressed together, metal particles 62P in adhesive 62 may penetrate coating 76 and become shorted to traces 42. Metal particles 62P may also form electrical connections to pads 64P, thereby shorting traces 42 to pads 62P and electrically coupling printed circuit 38 to fabric structure 36.

Figure 15:
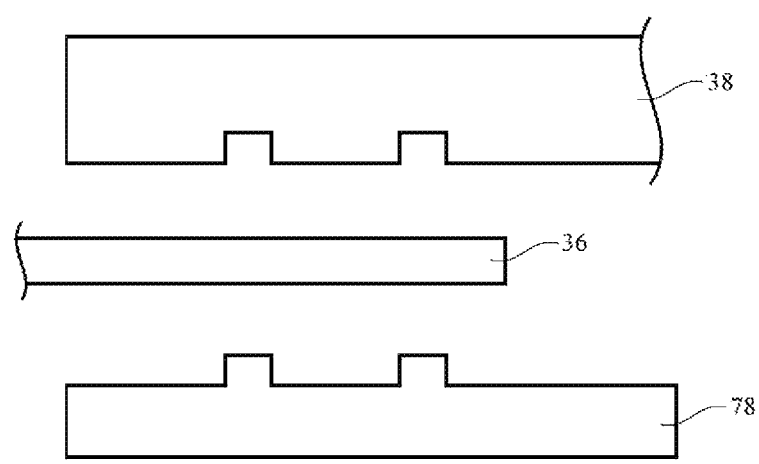
FIG. 15 is a cross-sectional side view of structures that may be used to help secure a flexible fabric signal path structure to other structures in an electronic device in accordance with an embodiment.

If desired, a set of interlocking structures of the type shown in FIG. 15 may be used to help secure fabric structure 36 to printed circuit 38. Printed circuit 38 (or other structure to which it is desired to attach fabric structure 36) may be provided with recesses and clamp structure 78 may be provided with mating protrusions. When structure 78 is attached to structure 38, the protrusions on structures 78 may help hold portions of fabric structure 36 within the mating recesses of printed circuit 38, thereby attaching structures 36 and printed circuit 38. If desired, a configuration of the type shown in FIG. 15 may be used in conjunction with the conductive adhesive structures of FIG. 14. Other types of clamps, clips, fasteners, adhesives, and attachment structures may also be used in securing fabric structure 36 to printed circuit 38 and/or other circuitry in cover 10'. The example of FIG. 15 is merely illustrative.

Figure 16:
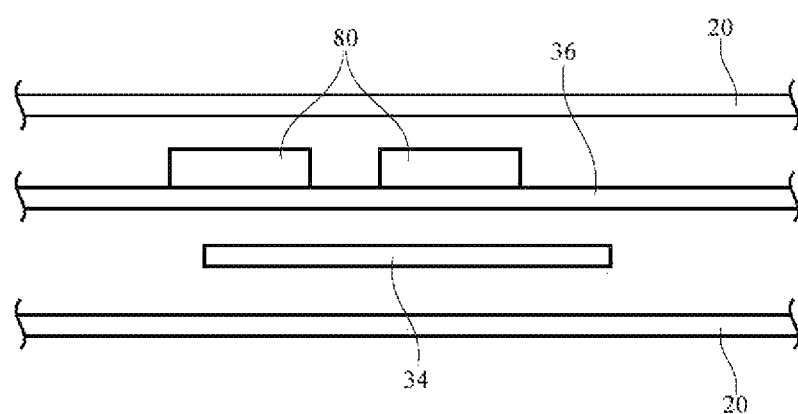
FIG. 16 is a cross-sectional side view of a portion of an electronic device having a flexible fabric signal path structure that has been populated with electrical components in accordance with an embodiment.

As shown in FIG. 16, components such as electrical components 80 may be mounted to fabric structure 36. For example, contacts on components 80 may be coupled to metal traces 42 in structure 36 using solder or conductive adhesive. Components 80 may include input-output devices and/or control circuitry (e.g., integrated circuits and other components of the type described in connection with circuitry 12 and devices 14 of FIG. 1). Components 80 and structure 36 may be enclosed within body 20. Optional stiffening members such as planar fiberglass member 34 of FIG. 16 may be used to help prevent bending of fabric 36 in the vicinity of components 80, thereby reducing the risk that components 80 might become dislodged from fabric 36.

Figure 17:
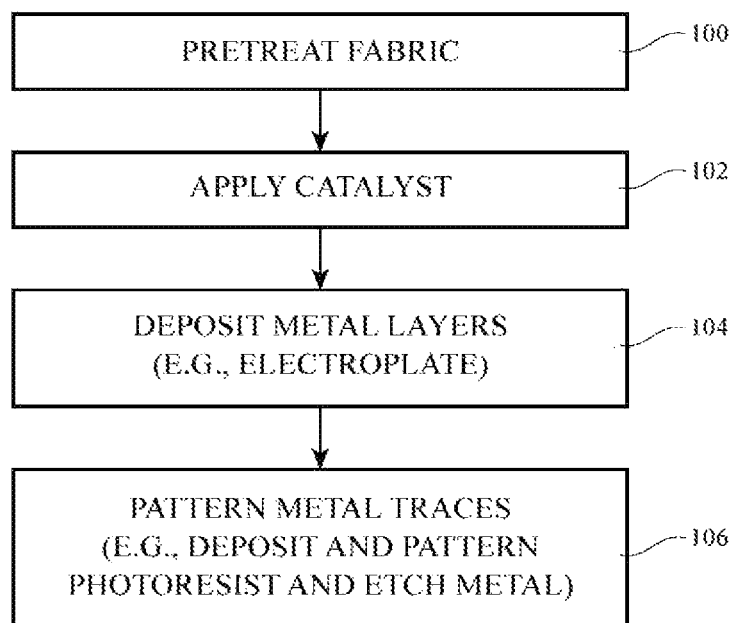
FIGS. 17 and 18 are flow charts of illustrative steps involved in forming flexible fabric signal path structures in accordance with embodiments.

Illustrative operations involved in forming fabric structure 36 are shown in FIG. 17. Fabric substrate 40 may be formed from polymer strands of material (e.g., nylon) or other suitable material. These strands may be woven together or may be intertwined using braiding techniques, knitting techniques, or other fiber intertwining techniques.

Substrate 40 may be pretreated at step 100 using chemicals, light, mechanical treatment (e.g., abrasion), or other pretreatment operations to prepare substrate 40 for application of electroplating catalyst material.

At step 102, catalyst (e.g., a metal seed layer) may be applied to fabric substrate layer 40 (e.g., using physical vapor deposition or other deposition techniques).

At step 104, metal electroplating operations or other suitable metal growth operations may be used to deposit one or more metal layers on one or both sides of substrate 40. As described in connection with FIG. 7, for example, metal layers 46, 48, and 50 may be formed on substrate 40 using electroplating techniques. Some of metal 46 may penetrate through the spaces between strands of material 44 in fabric 40 (see, e.g., openings 47 of FIG. 7, through which some of metal 46 has penetrated).

At step 106, the blanket metal film that has been formed from the deposited metal layer(s) on fabric 40 may be patterned to form metal traces 42. With one suitable arrangement, a masking layer such as a layer of polymer may be deposited and patterned on top of the metal layers. The polymer may be deposited and patterned using screen printing, using ink-jet printing, using blanket deposition followed by light exposure and developing (e.g., the polymer may be a photoresist that is patterned using photolithographic techniques), or other techniques for forming patterned masks. Following formation of the polymer mask, wet and/or dry metal etching processes may be used to remove undesired portions of the deposited metal, thereby forming patterned metal traces 42. The polymer mask may then be stripped. If desired, a thin dielectric layer may be deposited over the traces for environmental protection (see, e.g., layer 76 of FIG. 14).

Figure 18:
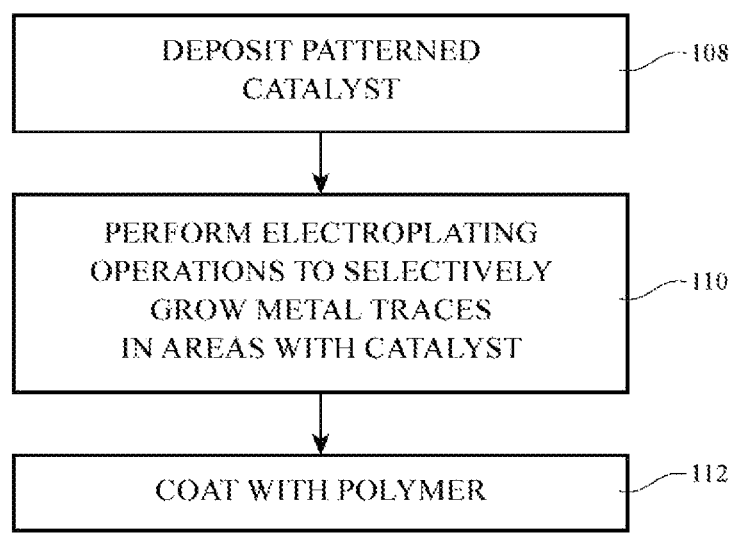

If desired, metal trace patterning may be accomplished by patterning the electroplating catalyst, as shown in FIG. 18.

At step 108, a catalyst (e.g., a metal seed layer) may be deposited in a desired pattern on fabric substrate 40 (e.g., using physical vapor deposition through a shadow mask, using inkjet or screen printing, using blanket film deposition followed by photolithographic patterning, etc.).

At step 110, electroplating operations may be performed to grow metal layer(s) such as layers 46, 48, and 50 of FIG. 7. These metal layers will grow selectively in the areas where catalyst is present and will not grow where catalysis is not present, thereby forming patterned metal traces 42.

An environmental protection layer such as layer 76 of FIG. 14 may be formed over metal traces 42 at step 112.

If desired, other patterning techniques (screen printing and/or inkjet printing of metal paint, spraying, dripping, etc.) may be used in forming metal traces 42 of desired patterns for fabric structure 36. The techniques of FIGS. 17 and 18 are merely illustrative.

The foregoing is merely illustrative and various modifications can be made by those skilled in the art without departing from the scope and spirit of the described embodiments. The foregoing embodiments may be implemented individually or in any combination.

What is claimed is:

1. A cover for an electronic device, comprising:
    a body having first and second portions, wherein the body folds along a bend axis between the first and second portions and wherein the body has an exterior surface;
    a keyboard on the first portion of the body;
    a connector on the second portion of the body, wherein the connector is located on the exterior surface of the body; and
    a flexible signal path that crosses the bend axis and that couples the keyboard to the connector, wherein the flexible signal path comprises conductive traces that are perpendicular to the bend axis.

2. The cover defined in claim 1 wherein the body folds along first and second additional bend axes that are parallel to the bend axis, wherein the first additional bend axis is interposed between the bend axis and the second additional bend axis, wherein the cover is configurable in a stand position in which the cover props up and connects to the electronic device, and wherein when the cover is in the stand position, the cover is unfolded at the bend axis and folded at the first and second additional bend axes.

3. The cover defined in claim 1 wherein the flexible signal path comprises fabric and wherein the flexible signal path comprises a layer of metal on the fabric.

4. The cover defined in claim 3 wherein the conductive traces comprise metal traces and wherein the layer of metal is patterned to form the metal traces.

5. The cover defined in claim 4 wherein the connector comprises first, second, and third contacts, and wherein the metal traces include a first metal trace coupled to the first contact, a second metal trace coupled to the second contact, and a third metal trace coupled to the third contact.

6. The cover defined in claim 1 wherein the keyboard comprises a printed circuit and an array of key switches on the printed circuit.

7. The cover defined in claim 6 wherein the printed circuit has opposing upper and lower surfaces, wherein the key switches are located on the upper surface, and wherein an electrical contact is located on the lower surface, the cover further comprising:
    conductive adhesive that couples the electrical contact to the flexible signal path.

8. The cover defined in claim 7 further comprising insulating adhesive that at least partially surrounds the conductive adhesive.

9. The cover defined in claim 7 further comprising a fabric layer that overlaps the array of key switches.

10. The cover defined in claim 1 wherein the body folds along an additional bend axis and wherein the flexible signal path crosses the additional bend axis.

11. A cover for a tablet computer, comprising:
    a housing having first and second portions separated by a flexible hinge, wherein the second portion folds along at least first and second fold axes;
    a keyboard in the first portion;
    a stiffener in the second portion;
    an electrical contact on an outer surface of the housing; and
    a conductive signal path that overlaps the flexible hinge and the stiffener, wherein the conductive signal path has a first end coupled to the keyboard and a second end coupled to the electrical contact.

12. The cover defined in claim 11 further comprising:
    first and second additional flexible hinges; and first and second additional stiffeners, wherein the flexible hinge and the first and second additional flexible hinges are interspersed with the stiffener and the first and second additional stiffeners in the second portion.

13. The cover defined in claim 11 wherein the conductive signal path comprises a metal layer on a fabric substrate.

14. The cover defined in claim 13 wherein the metal layer penetrates through openings in the fabric substrate.

15. The cover defined in claim 11 wherein the flexible hinge allows the housing to bend about a bend axis and wherein the flexible signal path is perpendicular to the bend axis.

16. A cover for an electronic device, comprising:
    a housing that folds along a bend axis;
    a plurality of electrical contacts on an outer surface of the housing;
    a keyboard;
    a first fabric layer that covers the keyboard; and
    a second fabric layer that crosses the bend axis and that includes metal traces coupled between the keyboard and the plurality of electrical contacts.

17. The cover defined in claim 16 wherein the housing folds along first and second additional bend axes and wherein the second fabric layer crosses the first and second additional bend axes.

18. The cover defined in claim 16 wherein the second fabric layer comprises woven fabric and the metal traces are formed from a patterned layer of metal.

19. The cover defined in claim 16 wherein the keyboard comprises a printed circuit having electrical contacts that are coupled to the metal traces.

20. The cover defined in claim 19 further comprising a conductive adhesive that couples the electrical contacts to the metal traces.

* * * * *